United States Patent
Yamane

(10) Patent No.: US 8,629,598 B2
(45) Date of Patent: Jan. 14, 2014

(54) BOUNDARY ACOUSTIC WAVE DEVICE

(75) Inventor: Takashi Yamane, Nagaokakyo (JP)

(73) Assignee: Murata Manufactruing Co., Ltd., Kyoto (JP)

( * ) Notice: Subject to any disclaimer, the term of this patent is extended or adjusted under 35 U.S.C. 154(b) by 102 days.

(21) Appl. No.: 12/939,378

(22) Filed: Nov. 4, 2010

(65) Prior Publication Data

US 2011/0050034 A1      Mar. 3, 2011

Related U.S. Application Data

(63) Continuation of application No. PCT/JP2009/001475, filed on Mar. 31, 2009.

(30) Foreign Application Priority Data

May 12, 2008  (JP) .................................. 2008-124496

(51) Int. Cl.
*H03H 9/02*   (2006.01)
*H03H 9/64*   (2006.01)

(52) U.S. Cl.
CPC .......... *H03H 9/0222* (2013.01); *H03H 9/6423* (2013.01)
USPC ..................................................... 310/313 A

(58) Field of Classification Search
CPC .............. H03H 9/0222; H03H 9/1452; H03H 9/14541; H03H 9/6423
USPC ....... 310/313 R, 313 A, 313 B, 313 C, 313 D
See application file for complete search history.

(56) References Cited

U.S. PATENT DOCUMENTS

| | | |
|---|---|---|
| 2006/0220494 A1 | 10/2006 | Miura et al. |
| 2007/0229192 A1 | 10/2007 | Miura et al. |
| 2009/0115287 A1 * | 5/2009 | Kando ....................... 310/313 A |

FOREIGN PATENT DOCUMENTS

| | | | |
|---|---|---|---|
| EP | 1 879 291 A1 | 1/2008 | |
| JP | 2006-279609 A | 10/2006 | |
| JP | 2007-267366 A | 10/2007 | |
| WO | 98/52279 A1 | 11/1998 | |
| WO | 2006/114930 A1 | 11/2006 | |
| WO | WO 2006/114930 | * 11/2006 | ............. H03H 9/145 |

OTHER PUBLICATIONS

Official Communication issued in International Patent Application No. PCT/JP2009/001475, mailed on Jun. 30, 2009.

* cited by examiner

*Primary Examiner* — Derek Rosenau

(74) *Attorney, Agent, or Firm* — Keating & Bennett, LLP

(57) ABSTRACT

A boundary acoustic wave device includes a first medium layer made of a first dielectric material and a second medium layer made of a second dielectric material having an acoustic velocity different from the acoustic velocity of the first dielectric material. The first medium layer and the second medium layer are disposed on a piezoelectric substrate, and an IDT electrode is arranged along the interface between the piezoelectric substrate and the first medium layer. When the fast transverse bulk wave of the piezoelectric substrate has an acoustic velocity V1 and a higher-order mode boundary acoustic wave has an acoustic velocity Va at an anti-resonance point, the boundary acoustic wave device satisfies the relationship Va>V1.

9 Claims, 5 Drawing Sheets

BOUNDARY ACOUSTIC WAVE DEVICE

BACKGROUND OF THE INVENTION

1. Field of the Invention

The present invention relates to boundary acoustic wave devices using boundary acoustic waves propagating along an interface between a piezoelectric substrate and a dielectric layer, and more particularly, to a boundary acoustic wave device having a three-media structure including a second medium layer made of a first dielectric material disposed on a first medium layer made of a second dielectric material.

2. Description of the Related Art

Boundary acoustic wave devices have recently received significant attention as an alternative to surface acoustic wave devices. Boundary acoustic wave devices do not require hollow packages. Accordingly, the size of resonators and filters can be significantly reduced by using boundary acoustic wave devices.

WO 98/52279 discloses a boundary acoustic wave device having a three-layer structure including a first medium layer and a second medium layer disposed on a piezoelectric substrate. As shown in FIG. 8, an interdigital electrode (not shown) is arranged on a piezoelectric substrate 1001, and a polycrystalline silicon oxide film is disposed as the first medium layer 1002 on the piezoelectric substrate 1001. A polycrystalline silicon film is disposed as the second medium layer 1003 on the first medium layer 1002. The IDT electrode is arranged along the interface between the piezoelectric substrate and the polycrystalline silicon oxide film.

By forming the polycrystalline silicon film, as shown in FIG. 8, the boundary acoustic wave energy excited by the IDT electrode is confined in the first medium layer 1002 made of polycrystalline silicon oxide.

Also, even if the polycrystalline silicon film is degraded or deteriorated, the electrical properties are not substantially impaired. In addition, since the polycrystalline silicon oxide film and the polycrystalline silicon film protect the IDT electrode, the reliability is improved. Furthermore, the use of a three-media structure can produce a high-frequency device.

However, in the boundary acoustic wave device having the three-media structure disclosed in WO 98/52279, higher-order mode spurious responses often occur. The magnitude of the higher-order mode spurious responses varies depending on the thickness of the silicon oxide film.

The magnitude of spurious responses can be reduced by reducing the thickness of the silicon oxide film.

Unfortunately, if the thickness of the silicon oxide film is reduced, the temperature coefficient of frequency (TCF) of the boundary acoustic wave device becomes negative, and its absolute value is increased. This means that the suppression of higher-order mode spurious responses and the improvement in TCF have a trade-off relationship.

SUMMARY OF THE INVENTION

To overcome the problems described above, preferred embodiments of the present invention provide a boundary acoustic wave device having a three-media structure that prevents or reduces higher-order mode spurious responses, and that has superior temperature characteristics such that the absolute value of the temperature coefficient of resonant frequency (TCF) is small.

According to a preferred embodiment of the present invention, a boundary acoustic wave device includes a piezoelectric substrate, a first medium layer made of a first dielectric material disposed on the piezoelectric substrate, a second medium layer made of a second dielectric material different from the first dielectric material and disposed on the upper surface of the first medium layer, and an IDT electrode arranged along the interface between the piezoelectric substrate and the first medium layer. The acoustic velocity of the second dielectric material of the second medium layer is different from that of the first dielectric material of the first medium layer. When a fast transverse bulk wave of the piezoelectric substrate has an acoustic velocity V1 and a higher-order mode boundary acoustic wave at an anti-resonance point has an acoustic velocity Va, the relationship Va>V1 is satisfied.

When a higher-order mode boundary acoustic wave has an acoustic velocity Vr at a resonance point, the boundary acoustic wave device preferably satisfies the relationship Vr>V1. Thus, higher-order mode spurious responses are effectively prevented.

In a preferred embodiment of the present invention, the acoustic velocity of the second medium layer is preferably greater than that of the first medium layer. In this case, the waveguide effect is improved, and the characteristics of the boundary acoustic wave device are further improved.

Preferably, the piezoelectric substrate is made of $LiNbO_3$ single crystal or $LiTaO_3$ single crystal, for example. In such a case, the electromechanical coupling coefficient is increased. Accordingly, the characteristics of the boundary acoustic wave device are improved.

In a preferred embodiment of the present invention, the acoustic velocity of the first medium layer is preferably less than the greater of the acoustic velocity in the slow transverse wave acoustic velocity of the $LiNbO_3$ single crystal and the acoustic velocity of the second medium layer. In this case, the waveguide effect is improved, and the characteristics of the boundary acoustic wave device are further improved.

Preferably, the first medium layer is made of $SiO_2$ or SiON, for example. Piezoelectric single crystals such as $LiNbO_3$ have negative temperature coefficients of frequency (TCF), while the $SiO_2$ and SiON have positive temperature coefficients of frequency (TCF). Accordingly, the absolute value of the temperature coefficient of frequency (TCF) of the boundary acoustic wave device is effectively reduced.

Preferably, the second medium layer is preferably made of at least one material selected from the group consisting of $SiO_2$, SiN, SiON, AlN, AlO, Si, SiC, DLC (diamond-like carbon), and polysilicon, for example. In this case, the waveguide effect is improved, and the characteristics of the boundary acoustic wave device are still further improved.

Preferably, the IDT electrode preferably includes a metal layer made of a metal selected from the group consisting of Al, Ti, Fe, Cu, Ag, Ta, Au and Pt, or an alloy primarily including the metal, for example. In this instance, the reflection coefficient and the conductivity of the IDT electrode are increased. Thus, the characteristics of the boundary acoustic wave device are still further improved.

The IDT electrode may preferably include a multilayer metal film including a plurality of metal layers, each made of a metal selected from the group consisting of Al, Ti, Fe, Cu, Ag, Ta, Au and Pt, or an alloy primarily including the metal, for example.

In the boundary acoustic wave device according to various preferred embodiments of the present invention, the higher-order mode boundary acoustic wave at an anti-resonance point has an acoustic velocity Va greater than the acoustic velocity V1 of the fast transverse bulk wave of the piezoelectric substrate. Accordingly, higher-order mode spurious responses are effectively prevented. Since higher-order mode spurious responses can be prevented without reducing the thickness of the material of the first medium layer, the boundary acoustic wave device is compatible to prevent or reduce higher-order mode spurious responses and to improve the device in temperature coefficient of frequency (TCF) by appropriately selecting the material of the first medium layer. Thus, various preferred embodiments of the present invention provide a boundary acoustic wave device which is not significantly affected by higher-order mode spurious responses and whose characteristics are not substantially varied by temperature changes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

Figure 1A:
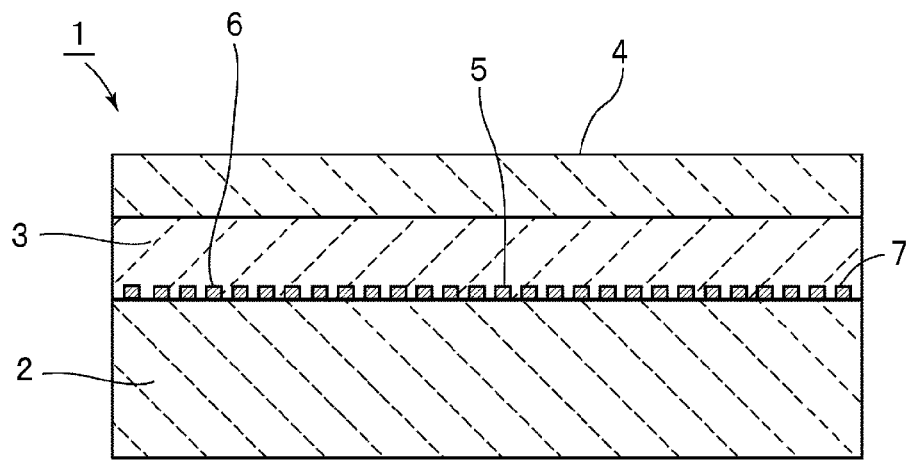
FIGS. 1A and 1B are a front sectional view of a boundary acoustic wave device according to a preferred embodiment of the present invention and a schematic plan view of the electrode structure of the boundary acoustic wave device.
Figure 1B:
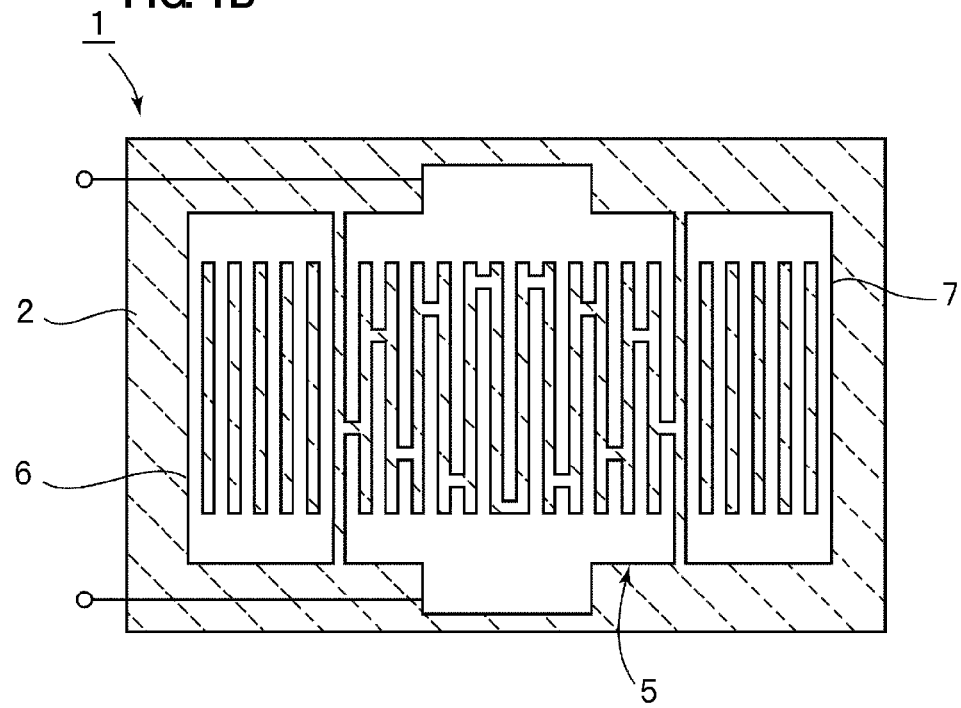

FIGS. 1A and 1B are a front sectional view of a boundary acoustic wave device according to a preferred embodiment of the present invention and a schematic top sectional view of the structure of an electrode of the boundary acoustic wave device.

The boundary acoustic wave device 1 includes a piezoelectric substrate 2 preferably made of a $LiNbO_3$ single crystal, for example. Alternatively, the material of the piezoelectric substrate 2 may be a $LiTaO_3$ single crystal or a rock crystal without being limited to $LiNbO_3$ single crystal.

$LiNbO_3$ and $LiTaO_3$ have negative temperature coefficients of resonant frequency (TCF). Accordingly, the absolute value of the temperature coefficient of resonant frequency (TCF) of the boundary acoustic wave device 1 can advantageously be reduced by combining these materials and $SiO_2$.

A first medium layer 3 and a second medium layer 4 are disposed in that order on the piezoelectric substrate 2. Thus, the boundary acoustic wave device 1 of the present preferred embodiment has a three-media structure.

The first medium layer 3 is made of a first dielectric material. In the present preferred embodiment, the first medium layer it is preferably made of $SiO_2$, for example. Although the first dielectric material used for the first medium layer 3 is not limited to $SiO_2$, either $SiO_2$ or SiON, for example, which has a positive temperature coefficient of frequency, is preferably used. These materials reduce the temperature dependence of the characteristics of the boundary acoustic wave device 1.

The second medium layer 4 is made of a second dielectric material whose acoustic velocity is different from the acoustic velocity of first dielectric layer of the first medium layer 3. In the present preferred embodiment, the second medium layer 4 is preferably made of SiON, for example. Any dielectric material having an acoustic velocity different from the acoustic velocity of the first medium layer 3 can be used as the dielectric material of the second medium layer 4. If the first medium layer 3 is made of a dielectric material other than $SiO_2$, the second medium layer 4 may be made of $SiO_2$.

Preferably, the material of the second medium layer 4 is at least one dielectric material selected from the group consisting of $SiO_2$, SiN, SiON, AlN, AlO, Si, SiC, DLC (diamond-like carbon), and polysilicon, for example. By using at least one material selected from this group, the waveguide effect is improved so as to provide superior characteristics.

An IDT electrode 5 and reflectors 6 and 7 are arranged along the interface between the piezoelectric substrate 2 and the first medium layer 3. Thus, the boundary acoustic wave device 1 includes the IDT electrode 5 and the reflectors 6 and 7 as an electrode structure.

As shown in FIG. 1B, the reflectors 6 and 7 are arranged at both sides of the IDT electrode 5 in the direction in which boundary waves propagate. Thus, a single-port boundary acoustic wave resonator is provided.

The boundary acoustic wave device of preferred embodiments of the present invention can be applied to a variety of devices, such as boundary acoustic wave filters, without being limited to a boundary acoustic wave resonator. Accordingly, the structure of the electrode can be modified according to the function of the intended boundary acoustic wave device.

As described above, the known boundary acoustic wave device having a three-media structure disclosed in WO 98/52279 has a problem in that higher-order mode ripples occur. In addition, reducing the thickness of the $SiO_2$ first medium layer can suppress higher-order mode ripples, but tends to degrade the temperature coefficient of frequency (TCF).

The inventors of the present invention studied the structure that is capable of reducing higher-order mode ripples without reducing the thickness of the $SiO_2$ layer. As a result, the inventors of the present invention discovered that higher-order mode ripples can be effectively prevented by setting the acoustic velocity V1 of the fast transverse bulk wave of the piezoelectric substrate 2 and the acoustic velocity Va of the higher-order mode boundary acoustic wave at an anti-resonance point so as to satisfy the relationship: Va>V1. It will be described below with reference to specific experimental examples that by setting the acoustic velocities, Va and V1, so as to satisfy the relationship Va>V1, higher-order mode ripples are effective prevented without reducing the thickness of the first medium layer 3.

First Experimental Example

Figure 2:
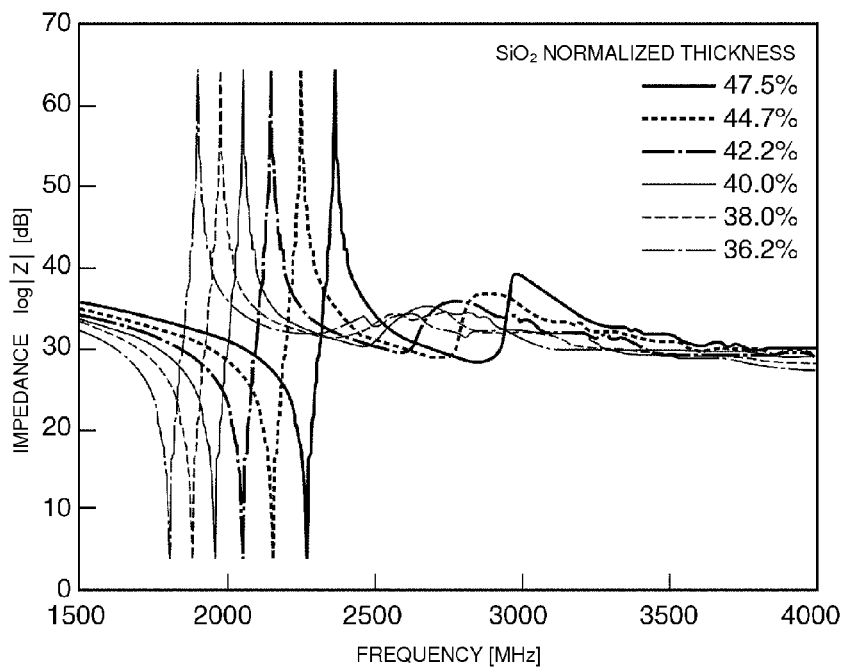
FIG. 2 is a plot of the results of a first experimental example performed on a boundary acoustic wave device according to a preferred embodiment of the present invention, showing the relationship between the impedance and the frequency.

FIG. 2 is a plot showing the impedance characteristics of the boundary acoustic wave device 1 when the normalized thickness of the $SiO_2$ first medium layer 3 is, for example, about 47.5%, about 44.7%, about 42.2%, about 40.0%, about 38.0% or about 36.2%. The piezoelectric substrate 2 of the boundary acoustic wave device 1 was made of $LiNbO_3$ single crystal having a crystal orientation expressed by Euler angles (0°, 105°, 0°). The electrode structure including the IDT electrode 5 included a multilayer metal film formed by depositing a Pt layer, an Al layer and a Pt layer in that order. The normalized thicknesses of the Pt, Al and Pt layers were about 1.1%, about 8.6 and about 1.1%, respectively. The number of fingers of the IDT electrode 5 was 60, and the duty ratio was about 0.5. The wavelengths λ of the boundary waves corresponding to the $SiO_2$ normalized thicknesses were about 1.6 μm, about 1.7 μm, about 1.8 μm, about 1.9 μm, about 2.0 μm, and about 2.1 μm, respectively. The number of fingers of each of the reflectors 6 and 7 was 50. The normalized thickness of the SiON film defining the second medium layer 4 was about 158%. The thicknesses of the layers of the IDT electrode and the SiON film were normalized to the thickness corresponding to a wavelength λ of about 1.9 μm. The frequency (MHz) shown in FIG. 2 can be converted into an acoustic velocity V (m/s) from the equation using the wavelength λ of the electrode: acoustic velocity V (m/s)=λ(μm)×f (MHz).

Figure 3:
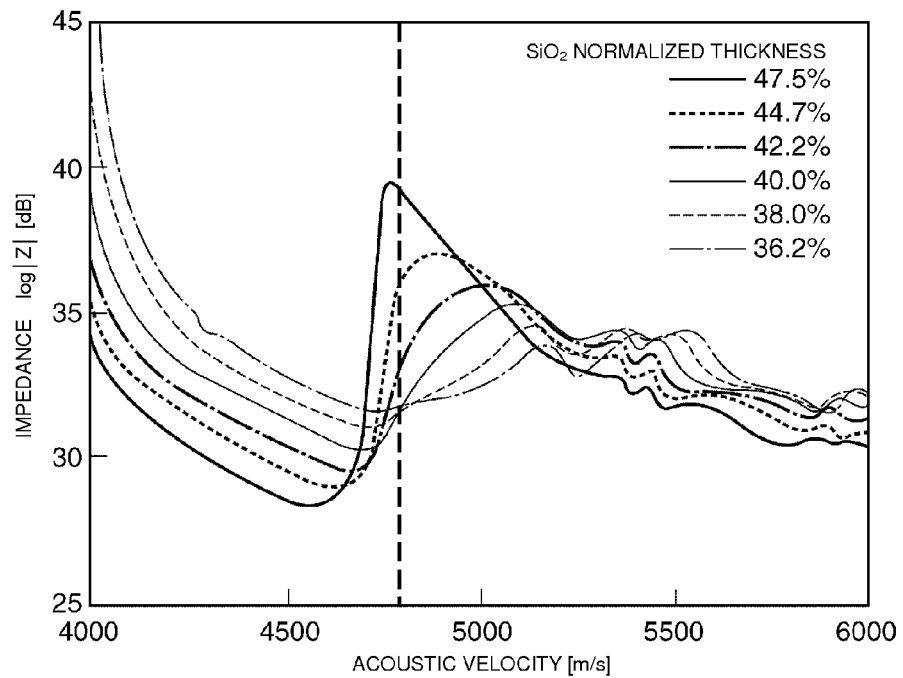
FIG. 3 is a plot of the results of the first experimental example performed on the boundary acoustic wave device according to a preferred embodiment of the present invention, showing the relationship between the impedance and the acoustic velocity in a portion exhibiting a higher order mode.

FIG. 3 is a plot showing the relationship between the impedance and the acoustic velocity in a portion exhibiting a higher order mode. As clearly shown in FIG. 3, if the normalized thickness of the $SiO_2$ film is changed, the higher-order mode acoustic velocity Vr at a resonance point and the higher-order mode acoustic velocity Va at an anti-resonance point change. When the $SiO_2$ normalized thickness is in the range of about 47.5% to about 36.2%, the acoustic velocity Vr at the resonance point is in the range of about 4700 m/s to about 4780 m/s, and the acoustic velocity Va at the anti-resonance point is in the range of about 4730 m/s to about 4780 m/s.

The acoustic velocity Va at an anti-resonance point refers to a value calculated according to the open grating circuit model, and the acoustic velocity Vr at a resonance point refers to a value calculated according to the short grating circuit model.

The acoustic velocity V1 of the fast transverse bulk wave of the piezoelectric substrate 2 was about 4750 m/s. However, the acoustic velocity of the fast transverse bulk wave is changed depending on the Euler angles.

As shown in FIG. 3, when the normalized thickness of the $SiO_2$ film is about 47.5% or about 44.7%, the higher-order mode acoustic velocity Va at the anti-resonance point is reduced to less than about 4750 m/s. In such cases, the magnitudes of higher-order mode spurious responses are about 26 dB and about 28 dB, respectively.

When the $SiO_2$ normalized thickness is about 42.2%, the higher-order mode acoustic velocity Va at the anti-resonance point is about 4750 m/s and the higher-order spurious is as low as about 29 dB. In the cases of $SiO_2$ normalized thicknesses of about 40.0%, about 38.0% and about 36.2%, where the higher-order mode acoustic velocities Va at the anti-resonance point are greater than about 4750 m/s, the magnitudes of the higher-order mode spurious responses are in the vicinity of 30 dB.

In the description provided above, the magnitude of the higher-order mode spurious response is represented by a ratio in impedance at the anti-resonance point between the higher order mode and the main mode. FIG. 2 shows that the impedance at the anti-resonance point is about 65 dB in the main mode. FIG. 3 shows when the $SiO_2$ normalized thickness is about 47.5%, the impedance at the anti-resonance point is about 39 dB in the higher order mode. Thus, the ratio in impedance between the higher order mode and the main mode is about 65 dB–about 39 dB=about 26 dB. Thus, the magnitude of the higher-order mode spurious is about 26 dB.

Figure 4:
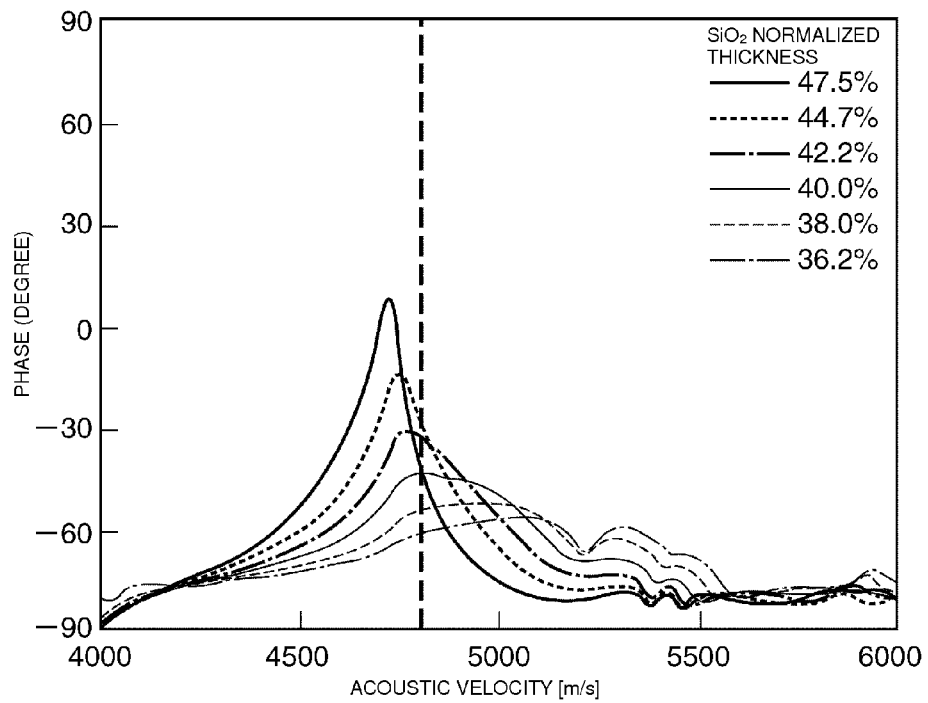
FIG. 4 is a plot of the results of the first experimental example performed on the boundary acoustic wave device according to a preferred embodiment of the present invention, showing the relationship between the phase and the acoustic velocity in the portion exhibiting a higher order mode.

FIG. 4 is a plot showing the relationship between the phase and the acoustic velocity in the portion exhibiting a higher order mode. As shown in FIG. 4, when the normalized thickness of the $SiO_2$ film was about 47.5% or about 44.7%, the higher-order mode acoustic velocity Va at the anti-resonance point is less than about 4750 m/s. The respective highest phases in the higher order mode are about 10° and about −10°.

On the other hand, when the $SiO_2$ normalized thickness was about 42.2%, the higher-order mode acoustic velocity Va at the anti-resonance point is about 4750 m/s and the highest phase in the higher order mode is as low as about −35°. In the cases of $SiO_2$ normalized thicknesses of about 40.0%, about 38.0% and about 36.2%, where the higher-order mode acoustic velocities Va at the anti-resonance point are greater than about 4750 m/s, the highest phases in the higher order mode are in the range of about −45° to about −55°.

FIGS. 2 to 4 show that by satisfying the relationship Va>V1, higher-order mode spurious responses are effectively prevented.

The higher-order mode acoustic velocity Vr at the resonance point is less than the higher-order mode acoustic velocity Va at the anti-resonance point. Thus, Va>Vr is satisfied. Accordingly, when Vr>V1 is satisfied, Va>V1 is satisfied. By satisfying the relationship Vr>V1, higher-order mode spurious responses are prevented with certainty.

Second Experimental Examples

Figure 5:
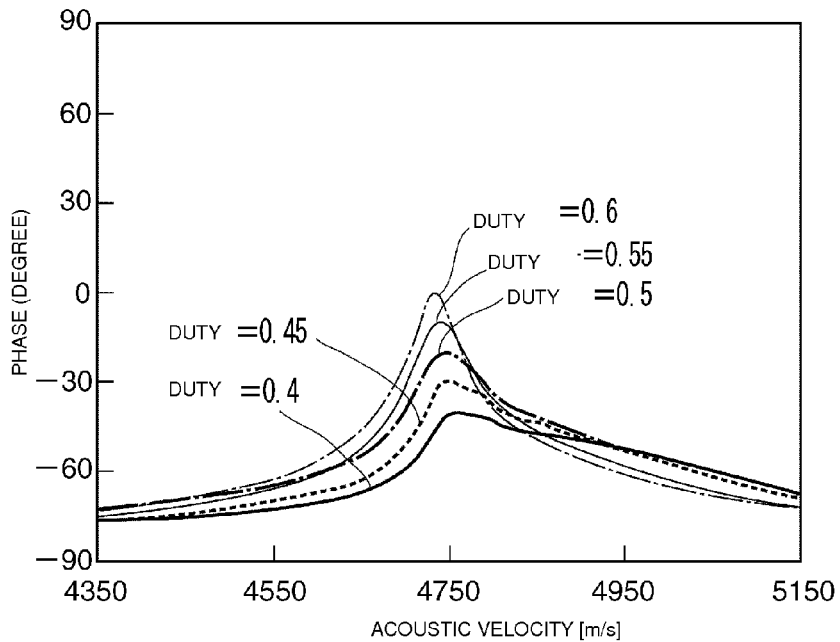
FIG. 5 is a plot of the results of a second experimental example, showing the relationship between the acoustic velocity and the phase.

A plurality of boundary acoustic wave devices were prepared in substantially the same manner as in the first experimental example except that the duties of the respective IDT electrodes 5 were set to about 0.4, about 0.45, about 0.5, about 0.55 and about 0.6. FIG. 5 shows the phase characteristics in a higher order mode of these boundary acoustic wave devices.

As shown in FIG. 5, when the duty is about 0.6, the higher-order mode acoustic velocity Va at an anti-resonance point is about 4750 m/s. On the other hand, when the duty is about 0.4, the higher-order mode acoustic velocity Va at an anti-resonance point should be about 4860 m/s. However, the anti-resonance point around 4860 m/s is not clear. This is because the higher-order mode is leaked to the $LiNbO_3$ layer by an increased higher-order mode acoustic velocity. It is therefore shown that when the duty is about 0.4, the highest phase is as low as very−40° in the vicinity of an acoustic velocity of about 4750 m/s, that is, higher-order mode spurious responses are effectively prevented.

Third Experimental Example

Electrodes including the IDT electrode 5 were formed by depositing a Pt layer, an Al layer, and a Pt layer in that order from the piezoelectric substrate 2 side for a Pt/Al/Pt multilayer metal film. In the multilayer metal film, the normalized thickness of the Al layer was set to about 8.6%, and the normalized thickness of the Pt layer at the first medium layer 3 side was changed to about 2.2%, about 1.65%, about 1.1%, about 0.55%, or 0% while the sum of the normalized thicknesses of the Pt layers was maintained constant or substantially constant. The sum of the normalized thicknesses of the Pt layers was about 2.2%.

Figure 6:
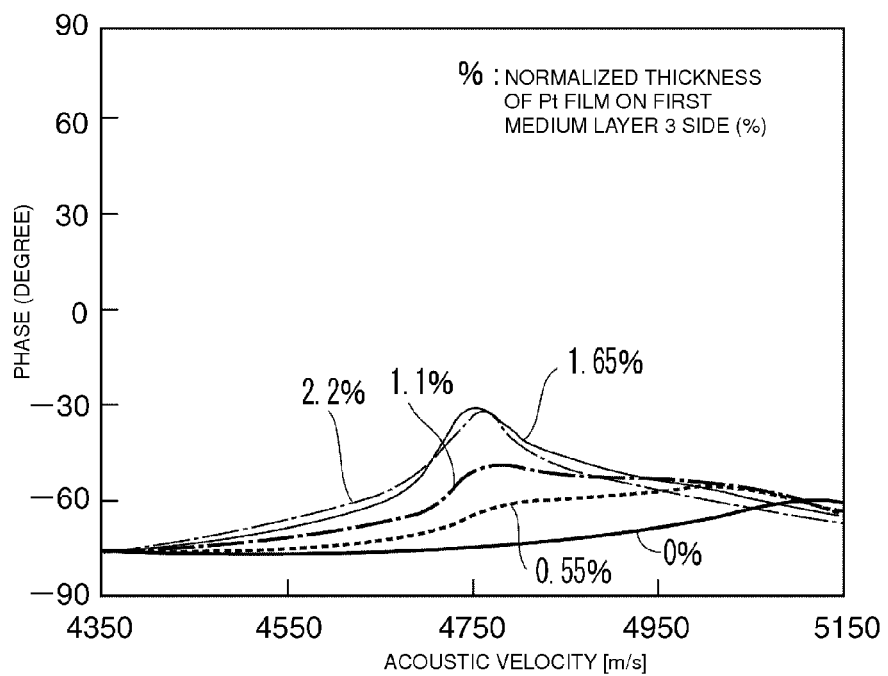
FIG. 6 is a plot of the results of a third experimental example, showing the relationship between the acoustic velocity and the phase.

FIG. 6 shows the relationship between the acoustic velocity and the phase of a plurality of boundary acoustic wave devices having the electrode structures described above.

As shown in FIG. 6, the higher order mode acoustic velocity Va at the anti-resonance point is greater than about 4750 m/s and the highest phase is low in each case shown in FIG. 6. Thus, it is shown that the higher-order mode spurious responses are effectively prevented.

Fourth Experimental Example

Electrodes including the IDT electrode 5 were formed by depositing an Al layer, a Pt layer, and an Al layer in that order from the piezoelectric substrate 2 side for an Al/Pt/Al multilayer metal film. In the Al/Pt/Al multilayer metal film, the normalized thickness of the Pt layer was set to about 2.2%, and the normalized thickness of the Al layer at the first medium layer 3 side was changed to 0%, about 2.04%, about 4.08%, about 6.12% or about 8.6% while the sum of the normalized thicknesses of the Al layers was maintained constant or substantially constant at about 8.6%. Thus, a plurality of boundary acoustic wave devices having such an electrode structure were prepared.

Figure 7:
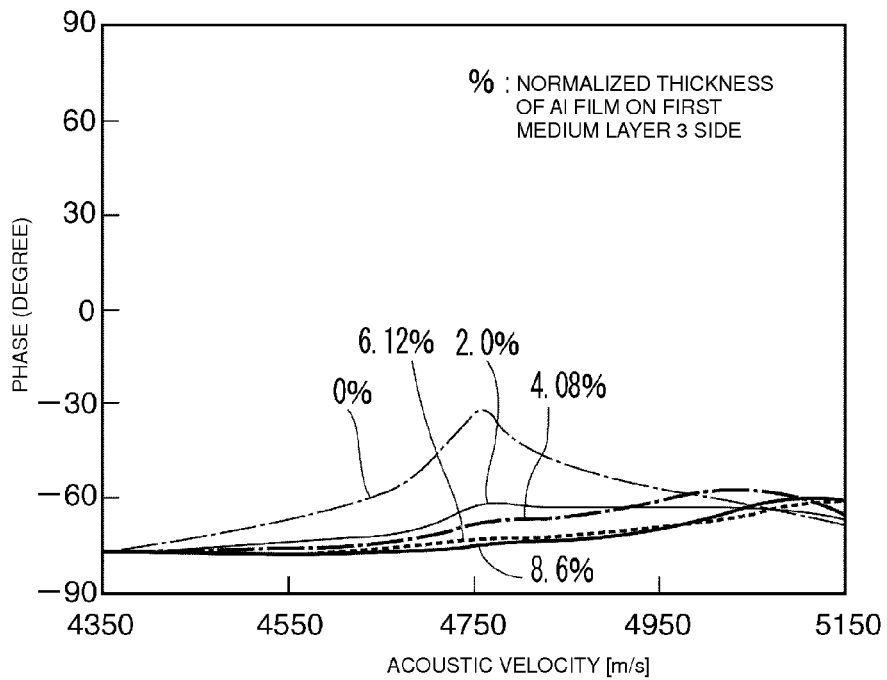
FIG. 7 is a plot of the results of a fourth experimental example, showing the relationship between the acoustic velocity and the phase.
Figure 8:
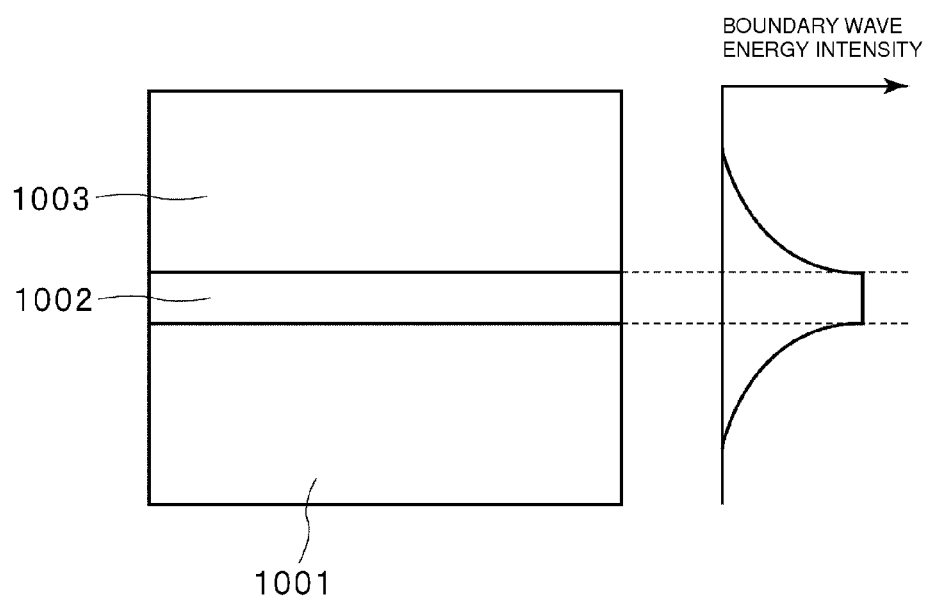
FIG. 8 is a schematic representation of a known boundary acoustic wave device.

FIG. 7 shows the relationship between the acoustic velocity and the phase of these boundary acoustic wave devices. In this instance, the duty was about 0.50, and the SiO$_2$ normalized thickness was about 40%. The other conditions were substantially the same as in the first experimental example.

As shown in FIG. 7, the higher-order mode acoustic velocity Va of the anti-resonance point is greater than about 4750 m/s and the highest phase is low in any case. Thus, it is shown that the higher-order mode spurious responses are effectively prevented.

As is clear from the third and fourth experiments, the IDT electrode may be defined by a multilayer metal film including a plurality of metal layers. In this case, the multilayer metal film may preferably include a plurality of metal layers, each made of a metal selected from the group consisting of Al, Ti, Fe, Cu, Ag, Ta, Au and Pt, or an alloy primarily including the metal, for example. In other words, a multilayer metal film may be used which includes a first metal layer made of a metal selected from the above group or an alloy primarily including the metal, and a second metal layer made of a metal selected from the above group or an alloy primarily including the metal except the metal of the first metal layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric substrate;
   a first medium layer made of a first dielectric material disposed on the piezoelectric substrate;
   a second medium layer disposed on an upper surface of the first medium layer, made of a second dielectric material having an acoustic velocity different from an acoustic velocity of the first dielectric material; and
   an IDT electrode arranged along an interface between the piezoelectric substrate and the first medium layer; wherein
   a value of at least one of a normalized thickness of the first medium layer, a duty of the IDT electrode, and a normalized thickness of the IDT electrode is set such that the boundary acoustic wave device satisfies a relationship Va>V1, where V1 represents an acoustic velocity of a fast transverse bulk wave of the piezoelectric substrate, and Va represents an acoustic velocity of a higher-order mode boundary acoustic wave at an anti-resonance point, such that the higher-order mode boundary acoustic wave is leaked to the piezoelectric substrate.

2. The boundary acoustic wave device according to claim 1, wherein the boundary acoustic device satisfies a relationship Vr>V1, where Vr represents an acoustic velocity of a higher-order mode boundary acoustic wave at a resonance point.

3. The boundary acoustic wave device according to claim 1, wherein the second medium layer has a higher acoustic velocity than the first medium layer.

4. The boundary acoustic wave device according to claim 1, wherein the piezoelectric substrate is made of LiNbO$_3$ single crystal or LiTaO$_3$ single crystal.

5. The boundary acoustic wave device according to claim 4, wherein the acoustic velocity of the first medium layer is less than the greater of an acoustic velocity in a slow transverse wave acoustic velocity of the LiNbO$_3$ single crystal and the acoustic velocity of the second medium layer.

6. The boundary acoustic wave device according to claim 1, wherein the first medium layer is made of SiO$_2$ or SiON.

7. The boundary acoustic wave device according to claim 1, wherein the second medium layer is made of at least one material selected from the group consisting of SiO$_2$, SiN, SiON, AlN, AlO, Si, SiC, diamond-like carbon, and polysilicon.

8. The boundary acoustic wave device according to claim 1, wherein the IDT electrode includes a metal layer made of a metal selected from the group consisting of Al, Ti, Fe, Cu, Ag, Ta, Au and Pt, or an alloy primarily including the metal.

9. The boundary acoustic wave device according to claim 8, wherein the IDT electrode includes a multilayer metal film including a plurality of metal layers, each made of a metal selected from the group consisting of Al, Ti, Fe, Cu, Ag, Ta, Au and Pt, or an alloy primarily including the metal.

* * * * *